Dec. 27, 1966 R. J. SPADY 3,295,126
ELECTRICAL APPARATUS
Filed Oct. 22, 1963
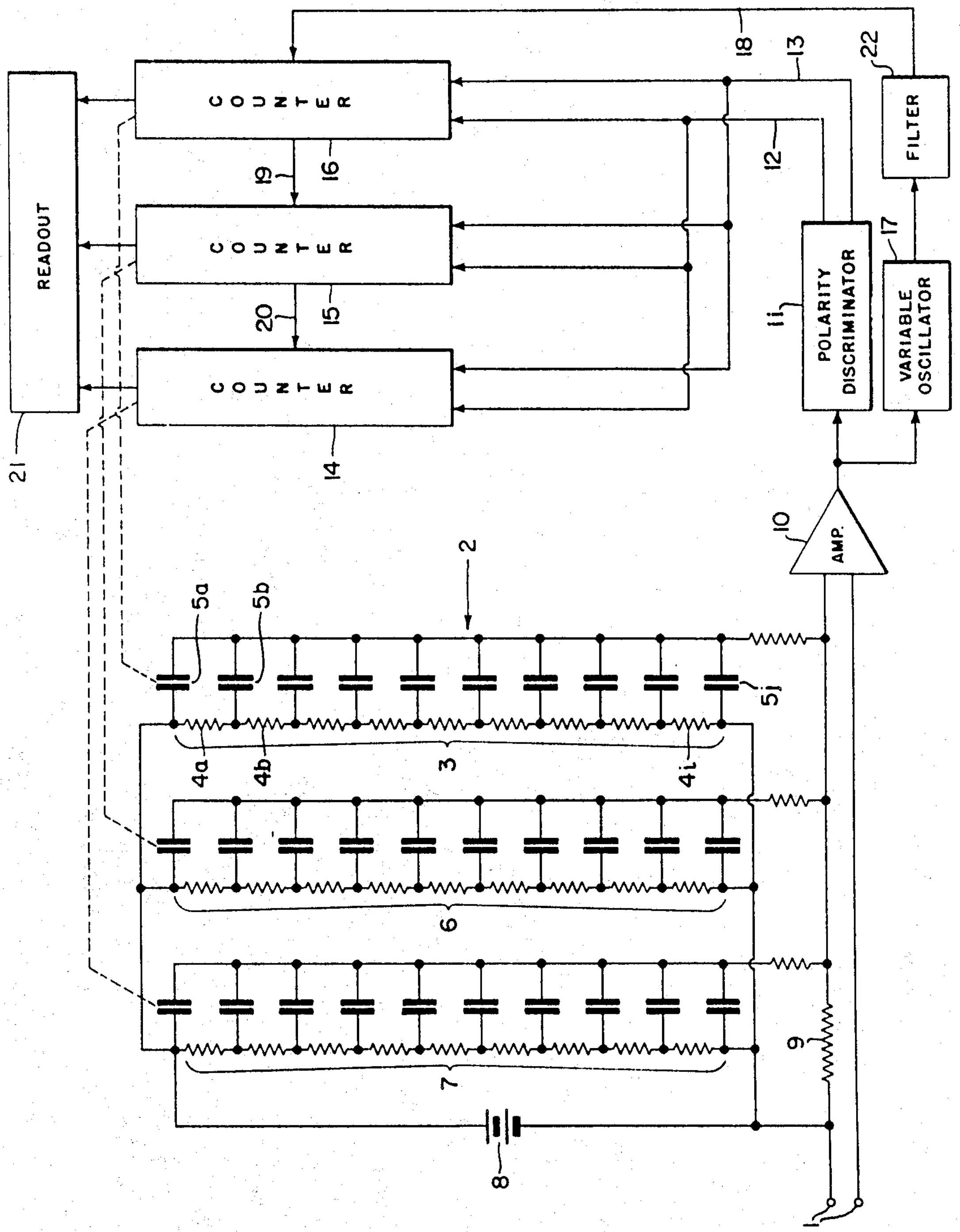
INVENTOR.
RICHARD J. SPADY
BY Arthur H. Swanson
ATTORNEY.

United States Patent Office 3,295,126

Patented Dec. 27, 1966

3,295,126

ELECTRICAL APPARATUS

Richard J. Spady, Feasterville, Pa., assignor to Honeywell Inc., a corporation of Delaware Filed Oct. 22, 1963, Ser. No. 317,986

5 Claims. (Cl. 340—347)

This invention relates to digital control devices. More specifically, the present invention relates to analog to digital converters.

An object of the present invention is to provide an improved analog to digital converter.

Another object of the present invention is to provide an improved analog to digital converter having an automatically variable digital conversion speed.

A further object of the present invention is to provide an improved analog to digital converter including means for terminating the digitizing operation upon the occurrence of a zero, or negligible, error between the signal to be digitized and the digital output.

A still further object of the present invention is to provide an improved analog to digital converter, as set forth herein, having a simplified operation and construction.

In accomplishing these and other objects, there has been provided, in accordance with the present invention, an analog to digital converter having a plurality of sequentially connected bidirectional decade counting circuits operative to adjust a reference signal in corresponding decade steps. A polarity discriminator is used to sense the polarity of an error signal representative of the difference between a signal to be digitized and the reference signal. The output signal of the discriminator is arranged to control the counting direction of the counting circuits. The error signal is also applied to a variable frequency oscillator to vary the frequency of the oscillator output signal directly with the magnitude of the error signal. The oscillator output signal is applied to the counting circuits to have the cycles thereof counted by the counting circuits. A frequency filter is used to stop the oscillator output signals below a frequency corresponding to a zero magnitude error signal.

A better understanding of the present invention may be had when the following detailed description is read in connection with the accompanying single figure drawing which is a schematic illustration of an analog to digital converter embodying the present invention.

Referring to the single figure drawing in more detail, there is shown an analog to digital converter embodying the present invention. A pair of input terminals 1 are arranged to be connected to a source of an unknown analog signal to be digitized. A variable reference signal circuit 2 is provided to supply a feedback signal to be compared with the unknown signal. The reference circuit 2 comprises three decade feedback signal circuits each having a plurality of resistance elements and related relay contacts. Thus, a first decade circuit 3 has a plurality of resistors *4a*, *4b*, . . . , *4i* and corresponding relay contacts *5a*, *5b*, . . . , *5j*. Similarly, a second decade circuit 6 and a third decade circuit 7 are provided to supply additional levels of feedback reference signals. The decade resistance elements are connected in series to form the decade, and the decades are connected in parallel across a reference power supply 8.

The reference signals supplied by each decade circuit are summed in feedback resistor 9 and connected in opposition to the unknown input signal. The combination of the feedback signal and the unknown signal is effective to develop an error, or difference, signal. This error signal is amplified by an error amplifier 10. The output signal from the amplifier 10 is applied to a polarity discriminator 11. The discriminator 11 may be any suitable device for providing a separate output signal for a corresponding polarity of the error signal applied thereto; such devices being well-known in the art. Thus, the discriminator 11 provides an output signal on an output line 12 when the error signal indicates a reference signal smaller than the unknown. The signal on line 12 is indicative of the need to increase the reference signal to decrease the error signal. On the other hand, an output signal from the discriminator on an output line 13 is indicative of a reference signal larger than the unknown signal and is used, as hereinafter described, to decrease the reference signal to thereby decrease the error or difference signal. In other words, the output signals from the discriminator 11, in either case, are used to control the reference signal to decrease the error signal by providing a reference signal equal to the unknown signal. Lines 12 and 13 are connected to separate inputs of three bidirectional decade counting circuits 14, 15 and 16. The signals appearing on lines 12 and 13, alternatively, are effective to control the direction of counting of the counters 14, 15 and 16.

A variable frequency oscillator 17 is used as a source of signals to be counted. The oscillator 17 has an input circuit connected to the output signal from the amplifier 10. The signal from the amplifier 10 is arranged to control the frequency of the output signals from the oscillator 17. Specifically, the error signal from the amplifier 10 is used to control the frequency of the signal from the oscillator 17 in direct proportion to the magnitude of the error signal. Accordingly, a large error signal is effective to provide a high frequency signal whereby a large number of pulses are produced during a given time. Conversely, a small error signal is effective to provide a lower frequency signal whereby a smaller number of pulses are produced during a given time. The output signal from the oscillator 17 is applied along line 18 to counter 16. Thus, counter 16 is used to count the cycles of the oscillator output signal. Further, the direction of the count is determined by the selective energization of lines 12 and 13; i.e., the counts stored in the counter 16 are selectively either increased or decreased. The counter 16 is used to control the relay contacts *5a*, *5b*, . . . , *5j*. In other words, as the count in the counter 16 is changed, the relay contacts are progressively actuated. Each relay contact is effective to apply the signal appearing at the junction of its associated resistors to the summing resistor 9. Thus, the signal supplied to summing resistor 9 is progressively varied under the control of the counters 14, 15 and 16. The resistors *4a*, *4b*, . . . , *4i* are weighted to provide steps in the feedback signal supplied to resistor 9. Specifically, in one embodiment, the first counter 16 is operated as a units counter and the resistors *4a*, *4b*, . . . , *4i* are each arranged to vary the feedback signals in equal one unit steps. For example, with the operation of a relay contact associated with the sixth resistor, the feedback signal has a magnitude of 6 units.

Similarly, the second counter 15 is used to step the relay contacts of the second decade 6 with the resistors in the second decade 6 each being weighted to change the feedback signal by equal ten unit steps. The third counter 14 is arranged to control the relay contacts of the third decade 7 having resistors weighted to provide a feedback signal change of equal hundred unit steps. For example, a relay connection to six unit resistors, five ten-unit resistors and three hundred-unit resistors would provide a total feedback signal of three hundred fifty-six units.

The counters 14, 15 and 16 are interconnected to provide a sequential bidirectional count of the signal from the oscillator 17. Thus, a completed operation of the first counter; i.e., ten counts, is effective to provide a single count signal along line 19 to the second counter 15. Thus, the second counter 15 is stepped one count for each ten counts of the first counter 15. Similarly, the end of an operation of the second counter is applied to the third counter 14 along line 20. Conversely, a reversal of the count direction in the first counter 16 under control of the discriminator 11 is effective to provide a count signal along line 19 upon the count in the first counter 16 reaching zero. Similarly, a reversal of the count direction in the second counter 15 is effective to provide a count signal to the third counter 14 upon a zero count in the second counter 15. Thus, the counters 14, 15 and 16 are interrelated to count up or down under the control of the discriminator 11. The count positions of the counters 14, 15 and 16 are communicated to a readout device 21 to provide a visual digital display, for example, of the count stored in the counters 14, 15 and 16.

In operation, the present invention is effective to compare a feedback signal developed across resistor 9 with the unknown signal applied to input terminals 1. This comparison is arranged to provide an error signal having a magnitude representative of the difference between the compared signals and a polarity dependent on the relative magnitude of the reference signal and the unknown signal; i.e., which one has a larger magnitude. Assuming a constant polarity of the input signal, the polarity discriminator 11 is effective to produce an output signal on either line 12 or line 13 depending on the aforesaid polarity relationship. The output signal from discriminator 11 is simultaneously applied to counters 14, 15 and 16 to determine the direction of their counting operation. The error signal is also applied to oscillator 17 to affect the frequency of the oscillator output signal. This oscillator control is arranged to produce a high frequency oscillator output signal for a large error signal and a low frequency signal for a small error signal. Thus, when the converter starts to digitize the input signal, the large error signal is effective to produce a high frequency output signal from the oscillator 17.

This high frequency signal is counted by the counters 14, 15 and 16 to provide a high-speed mode of operation of the relay contacts of the decades 3, 6 and 7. In other words, the units counter 16 counts the individual cycles of the oscillator signal and produces an output on line 19 for each ten cycle counts, and the tens counter 15 counts each output signal for the units counter 16 and produces an output on line 20 for each ten signals from counter 16. When the reference signal becomes greater than the unknown signal as a result of the increasing count of the counters 14, 15 and 16, the polarity of the error signal will reverse. This reversal is detected by the discriminator 11 and the output signal is shifted from one of the lines 12 and 13 to the other.

The counters are now operated to decrease their count in response to the further cycles of the oscillator output signal. Thus, starting with the units decade, the reference signal is reduced in steps of units, tens and hundreds by the signals on lines 19 and 20 until the polarity is again reversed. This process continues with polarity reversals and consequent changes in counting direction until the reference signal is equal to the unknown signal. The adjustment operation of the reference signal is effective to decrease the error signal as the reference signal is adjusted toward the unknown signal magnitude. However, as the magnitude of the error signal decreases, the frequency of the oscillator 17 is also decreased.

The decrease in the frequency of the oscillator output signal is effective to decrease the speed of the counting operation as the reference approaches the unknown signal. This decrease in the counting speed is effective to stabilize the overall operation of the converter during the conversion operation when the error signal has a very small magnitude. Further, the low frequency of the oscillator 17 at the small error signals improves the noise, or transient signal, response of the converter which noise might add to the small error signal and produce an erroneous operation of the counting and reference signal adjustment operation. In other words, as the error signal is reduced to a zero, or negligible, magnitude, the oscillator output signal is arranged to be a low frequency signal. This low frequency signal is effective to allow the converter to follow any small variations in the unknown signal.

Further, the converter operation may be advantageously modified to prevent any effect of negligible error signals by providing a frequency band-pass filter 22 at the output of the oscillator 17 to stop the operation of the converter when the frequency falls below the band-pass characteristic of the filter. The band-pass characteristic is selected to cut-off a frequency corresponding to an error signal having a zero, or negligible, magnitude. Such an arrangement would prevent the counting circuit from hunting between two final values of the reference signal which would be on both sides of the unknown signal.

Accordingly, it may be seen that there has been provided an analog to digital converter having a variable frequency of digitizing operation and including means to terminate the operation upon reaching a zero, or negligible, error signal.

What is claimed is:

1. An analog to digital converter comprising a plurality of bidirectional counting means connected in series to form increasing decade steps whereby a completion of a count in either direction in one of said counting means is effective to transfer a count signal to a succeeding adjacent one of said counting means, said counting means each including selectively responsive control means operative to determine the direction of a count in the respective ones of said counting means, reference signal supply means controlled by said counting means and operative to supply a plurality of weighted steps in the magnitude of a reference signal in response to a count in a corresponding one of said counting means, signal comparing means operative to compare the reference signal with an unknown signal to be digitized to provide a difference signal having a magnitude representative of the difference between said reference signal and said unknown signal and a polarity representative of the direction of said difference, polarity discriminating means responsive to said difference signal to provide a control signal indicative of said polarity, means connecting said control signal to all of said control means to determine the direction of the count in said counting means, and oscillator means connected to the first one of said counting means to provide signals to be counted thereby.

2. An analog to digital converter as set forth in claim 1 wherein said oscillator means also includes band-pass filter means connected in the output of said oscillator means in order to pass signals to be counted having a frequency within the band-pass characteristic of said filter means.

3. An analog to digital converter as recited in claim 1 wherein said reference signal supply means includes, at least one voltage divider network connected across a voltage source, and a plurality of switch means connected to said network, said switch means being selectively controlled by said counting means such that said network is selectively connected to said signal comparing means in accordance with the operation of said counting means.

4. An analog to digital converter as recited in claim 3 wherein said switch means comprise relays, each of said relays being selectively operated by the associated counting means to close the contacts thereof whereby the connection to said signal comparing means is effected.

5. An analog to digital converter as recited in claim 1 including readout means connected to said counting means for providing an instantaneously utilizable output which is indicative of the condition of said counting means.

References Cited by the Examiner

UNITED STATES PATENTS

| | | | |
|---|---|---|---|
| 2,775,754 | 12/1956 | Sink | 340—347 |
| 3,127,601 | 3/1964 | Kaenel | 340—347 |
| 3,201,781 | 8/1965 | Holland | 340—347 |

DARYL W. COOK, *Acting Primary Examiner.*

W. J. KOPACZ, *Assistant Examiner.*